(12) United States Patent
Funk et al.

(10) Patent No.: US 7,061,745 B2
(45) Date of Patent: Jun. 13, 2006

(54) VARIABLE CAPACITOR ADJUSTABLE BY LINEAR MOTOR

(75) Inventors: Alexander Layton Funk, Mountain View, CA (US); Weston Anderson, Palo Alto, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 10/949,768

(22) Filed: Sep. 24, 2004

(65) Prior Publication Data

US 2006/0067027 A1    Mar. 30, 2006

(51) Int. Cl.
*H01G 5/00* (2006.01)

(52) U.S. Cl. ............... 361/272; 361/273; 361/278; 361/279; 361/283.1; 361/283.3; 361/290

(58) Field of Classification Search ............ 361/272, 361/273, 277–278, 283.1, 283.3, 289–290, 361/292

See application file for complete search history.

(56) References Cited

U.S. PATENT DOCUMENTS

| | | | |
|---|---|---|---|
| 3,213,340 A | 10/1965 | Robertson | |
| 3,447,047 A | 5/1969 | Lindsay | |
| 4,035,697 A * | 7/1977 | Arnold, Jr. | ................. 361/289 |
| 4,837,516 A | 6/1989 | Takahashi | |
| 4,902,975 A | 2/1990 | Kess | |
| 5,590,015 A | 12/1996 | Planta et al. | |
| 5,657,006 A * | 8/1997 | Kinoshita et al. | ...... 340/870.37 |
| 5,818,683 A * | 10/1998 | Fujii | .......................... 361/277 |

\* cited by examiner

*Primary Examiner*—Nguyen T. Ha
(74) *Attorney, Agent, or Firm*—Bella Fishman

(57) ABSTRACT

The disclosure describes a variable capacitor device, which is formed by a linear motor and a variable capacitor having at least one stator electrode and a movable electrode. A piezoelectric transducer of the linear motor is frictionally coupled to the movable electrode. Application of electrical signals to the piezoelectric transducer of the linear motor produces a motion of the surface of the piezoelectric transducer. The frictional coupling between the piezoelectric transducer surface and the movable electrode transmits a fraction of piezoelectric transducer motion to the movable piston electrode thereby changing the capacity of the variable capacitor. The amount and sign of the capacitance change is selectable by the operator through control of the electrical signals applied to the piezoelectric transducer.

24 Claims, 8 Drawing Sheets

VARIABLE CAPACITOR ADJUSTABLE BY LINEAR MOTOR

BACKGROUND OF THE INVENTION

This invention relates to a variable capacitor adjustable by a linear motor. The linear motor is electrically adjustable and with circuit driver apparatus provides improved tuning and matching of NMR radio frequency probe coils.

An NMR spectrometer system is comprised of: a DC magnet which provides a stable, homogeneous static magnet field required for polarizing nuclear spins of a sample to be analyzed; a console containing an RF system which provides a suitable RF excitation source to the nuclear spins, and provides an amplifying and detection system for detecting and recording the NMR response signals from the nuclear spins; and a probe containing RF coils for coupling the RF excitation signals to the nuclear spins and for receiving response signals from the spins, and means for containing and positioned the sample within the probe coils to achieve optimum coupling between the sample spins and the RF probe coils.

For high resolution NMR studies the sample compound under investigation is usually dissolved in or mixed with a suitable solvent, is in liquid form and contained in a sample tube which is typically 5 mm in diameter. Solid samples may be a powder or crystal, and is some cases the sample may be contained in a magic angle spinning (MAS) probe for rapidly spinning the sample with the spinning axis tilted at an angle of approximately 54 degrees from the magnetic field axis. In either case the probe holds the sample tube and is positioned in the magnet so the sample is in the most homogeneous region of the magnetic field. The RF probe coil or coils for coupling the RF excitation to the sample and for detecting the NMR response signal must be tuned to the excitation frequencies and matched to the cable impedance leading to the preamplifier which may be located in the console or in the probe. The tuning and matching is typically done by variable capacitors that can be adjusted for optimum tuning and matching before running experiments with each sample.

Modern NMR spectrometer systems employ superconducting magnets typically consisting vertically mounted superconducting solenoid coils that are mounted in a Dewar structure with a central reentrant section extending up through the center of the superconducting solenoid coils. Typically the probe structure comprises a long cylindrical section that fits within the reentrant section of the magnet Dewar and a lower section that remains below the magnet Dewar that may contain a preamplifier and other parts. The sample and the transmit/receive RF probe coils are located in the cylindrical region of the probe. The probe is positioned in the magnet and Dewar structure so that the sample is centered on the center axis of the superconducting coils. This arrangement provides the most uniform magnetic field in the sample region. The space about the sample containing the RF coils and the tuning and matching capacitors is rather limited. Tuning and matching variable capacitors in this region have shafts extending to the lower region of the probe where they may be turned either manually or by motors located in this region or by more distant motors coupled by flexible cables.

A multi-frequency NMR probe has two or more RF probe coils with tune and match capacitors for each frequency. For example a triple resonance probe is capable of simultaneously operating at three different frequencies to excite three species of nuclear spins plus a "lock" signal. The "lock" signal typically is from deuterium nuclei in the solvent that may be deuterium oxide or deutero chloroform. To obtain optimum results with minimum excitation power, each of the four frequencies must be tuned and matched, requiring a total of eight variable capacitors. Because of limited space often compromises are made, and variable match capacitors may be provided for only one or two of the nuclei thereby reducing the variable capacitor count to 6 or less. In cryogenically cooled probes the RF probe coils are cooled to a low temperature. The coils may be either constructed of normal metals or high temperature superconducting materials. In these probes space is even more limited, with the further problem of heat transfer along the coupling shafts between the cold variable capacitors and the warm region at the bottom of the probe containing motors or knobs for manual adjustment. Heat transfer along these shafts puts an additional heat load upon the system used to provide the cooling.

Controlling the tune and match capacitors electrically provides the capability of remotely adjusting the tune and match capacitors thereby enabling the operator to remain at the console while tuning and matching the probe for optimum signal to noise ratio (S/N). To achieve it, the operator typically applies the desired excitation frequency and adjusts the tune and match capacitors to obtain a minimum of reflected power. Sometimes a small "dither" is applied to this frequency while the operator observes the reflected power from the probe. This enables the operator to readily determine whether the tune or match capacitor needs adjustment to further optimize the S/N.

It is also possible to use special software to control electrical signals applied to motors that are used to adjust the tune and match variable capacitors. Most prior art systems required a separate motor for each variable capacitor. As mentioned above, a shaft is run from the variable capacitor which is very close to the RF probe coil, to the motor at the bottom of the probe outside the magnet where space is limited. In all the prior art systems using superconducting magnets, one or more rotatable shafts were required to transmit the rotary motion of the motor located in the base of the probe to the sample region where the probe coils and tune and match capacitors are located. In cryogenic probes, the probe coils and tune and match capacitors are cooled to a low temperature. Problems with these systems include heat loss arising from heat being conducted up the rotatable shaft from the motor region which is near room temperature to the sample region which typically is at a very low temperature, usually at 25 K or less. To avoid a temperature rise due to this heat loss, additional cooling power is required. An another problem is maintaining alignment of the various parts in the cooled region. Forces are generated and transmitted along the rotatable shafts during the cooling phase causing misalignment of the NMR probe coils with each other and with the external magnet and gradient coils.

SUMMARY OF THE INVENTION

In accordance with the present invention, each electrically adjustable variable capacitor device comprises a variable capacitor coupled to a linear electrical motor. The variable capacitor comprises a stator electrode and a movable electrode and the linear motor comprises a stator transducer component and a movable piston. A piston electrode is a common component that serves as both the movable electrode of the capacitor and the movable piston of the linear motor. A dielectric housing supports the stator electrode of the capacitor and the stator part of the linear motor. The electrically adjustable variable capacitor device has an internal mechanism for adjusting the capacitance of the device in response to electrical signals applied to the device. No shafts are required to control the devices.

The adjustable variable capacitor assembly is supplied by an operating control unit, which provides electrical control current to the variable capacitor device. Electrical control currents are supplied over electrical conductors that have very low thermal conductivity. The internal drive mechanism and capacitance generating regions are combined to form a compact device. One electrically adjustable variable capacitor device can be used for each tune and one for each match variable capacitor in a NMR probe. In many cases sufficient space will be available so that all tune and match variable capacitors may be controllable by electrically adjustable variable capacitor devices resulting in better performance. Applying an appropriate electrical signal to it changes the capacity of this device. When the electrical signal is removed the electrical adjustable variable capacitor device retains the capacity value it had just prior to the removal of the electrical signal.

In order that the electrically adjustable variable capacitor device not perturb the homogeneity of the magnetic field, it is made of materials with a low magnetic susceptibility. No ferromagnetic or highly paramagnetic materials are used in construction. The device uses piezoelectric crystals or ceramic materials to convert the electrical drive to a mechanical motion. These materials are also capable of operating at the low temperature required for cryogenically cooled probes. They are also compatible with the vacuum requirements of cryogenically cooled probes.

BRIEF DESCRIPTION OF THE DRAWINGS

The preferred embodiments of the present invention is given by the way of non-limiting examples that will be described below with the reference to the accompanying drawings in which.

DETAILED DESCRIPTION OF THE INVENTION

Figure 1:
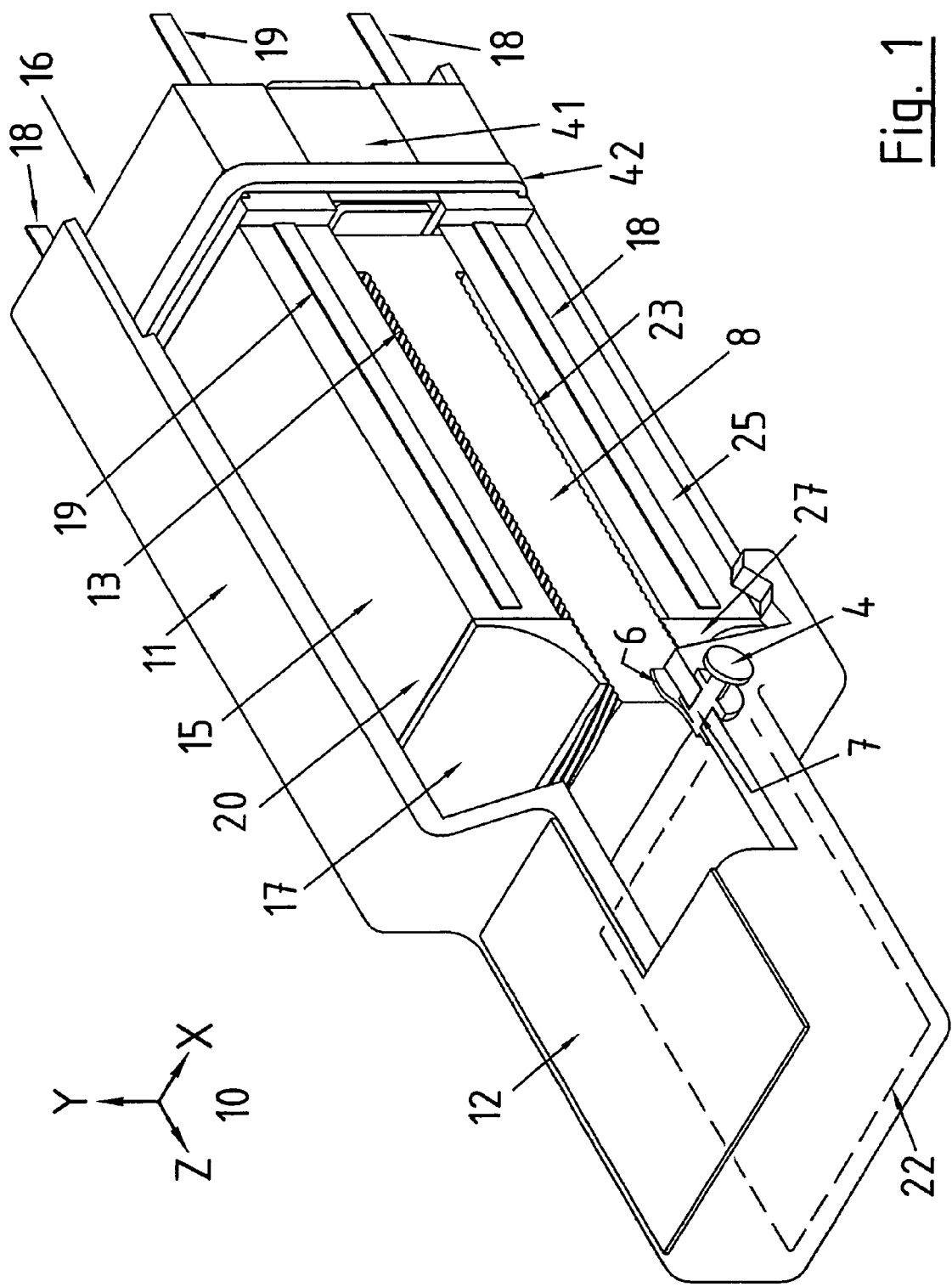
FIG. 1 is a cutaway isometric view of a section of an electrically adjustable variable capacitor device.

FIG. 1 is a cutaway isometric view showing the major elements of the invention. Dielectric housing 11 supports stator electrode 12 placed on the exterior of dielectric housing 11. On the interior of dielectric housing, a piston, with conductive surface 13, forms movable piston electrode 8. Stator electrode 12 and movable piston electrode 8 comprise a first variable capacitor. Conductive surface 13 extends around the entire periphery of piston electrode 8, making electrical contact with contact finger 6. The piston may be comprised of an insulator with a conductive metallic coating to provide conductive surface 13, or alternatively it may be made of a metal that provides conducting surface 13 and forms piston electrode 8. Electrical feed-through 7 provides an electrical connection between contact finger 6 and terminal 4. Stator electrode 12 and terminal 4 provide electrical connections to the first variable capacitor.

Piezoelectric transducer 15 has its proximal end 16 fixed to dielectric housing 11. Friction plate 17 is fixed to the distal end 20 of piezoelectric transducer 15. Friction plate 17 makes frictional contact with piston electrode 8 thereby providing a frictional coupling between piezoelectric transducer 15 and movable piston electrode 8. Voltage may be applied to piezoelectric transducer 15 by lead 18 and return lead 19 causing it to lengthen or shorten in the z-direction of coordinate axes 10.

In one embodiment the effective friction (or positional accuracy and repeatability) is enhanced between friction plate 17 and movable piston electrode 8 by forming a set of matching microgrooves on each member thereby restricting the relative static positions of piston electrode 8 to those in which the two microgrooves partially interlock.

Figure 2:
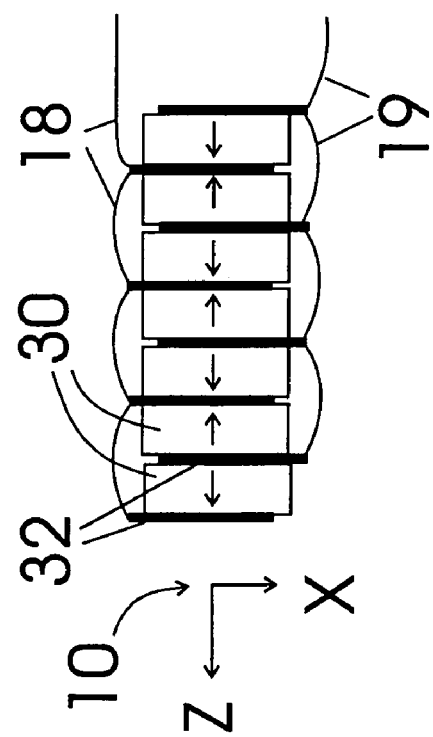
FIG. 2 is a diagram of the construction of a piezoelectric transducer from a plurality of piezoelectric actuators.

As shown in FIG. 2, piezoelectric transducer 15 comprises of a stack of actuators (piezoelectric elements) 30. Thin conductive electrodes 32 between each piezoelectric element 30 permits the application of a voltage across each piezoelectric element 30. Alternate conductive electrodes 32 are connected to lead 18 and return lead 19. Each adjacent piezoelectric element 30 is poled in the opposite direction, or for spontaneously piezoelectric crystals such as quartz, the alternate elements have reversed orientation as indicated by the arrows on the piezoelectric elements 30. Applying a positive voltage on lead 18 and a negative voltage on return lead 19 causes each element to expand. As shown in FIG. 1, the proximal end 16 of piezoelectric transducer 15 is fixed to dielectric housing 11, this expansion causes the distal end 20 of piezoelectric transducer 15 and friction plate 17 to move along the plus z-axis of coordinate axis 10. A negative voltage on lead 18 and a positive voltage on return lead 19 causes piezoelectric transducer 15 to contract and its distal end and friction plate 17 moves in the negative direction of the z-axis.

Figure 3A:
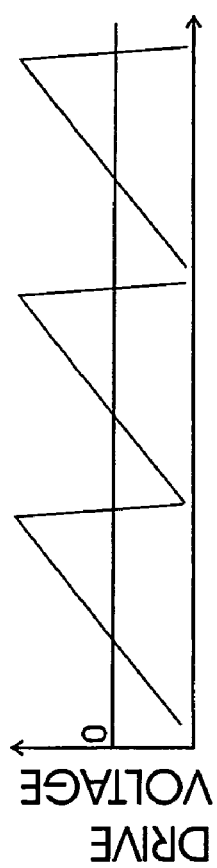
FIG. 3A is a sawtooth waveform with a slowly rising component and a rapidly falling component.

The principal of the linear motor drive might be called "stick and slip" motion, the combined effect of friction and inertia. Referring to FIG. 1, friction plate 17 presses against piston electrode 8, which is free to move along the z-direction of coordinate system 10. For slow motion of piezoelectric transducer 15, non-sliding contact is maintained between friction plate 17 and conductive surface 13 of piston electrode 8, moving piston electrode along with the motion of friction plate 17 and distal end 20 of piezoelectric transducer 15. For very rapid motions of piezoelectric transducer 15, friction between friction plate 17 and conductive surface 13 of piston electrode 8 is insufficient to overcome the inertia due to the mass of the piston and thereby preventing any substantial motion of piston electrode 8. By applying a saw-tooth drive voltage between lead 18 and return lead 19 that slowly rises and quickly falls, as shown in FIG. 3A, moves piston electrode 8 along the positive z-axis thereby increasing the capacitance between stator electrode 12 and conductive surface 13 of piston electrode 8.

Figure 4:
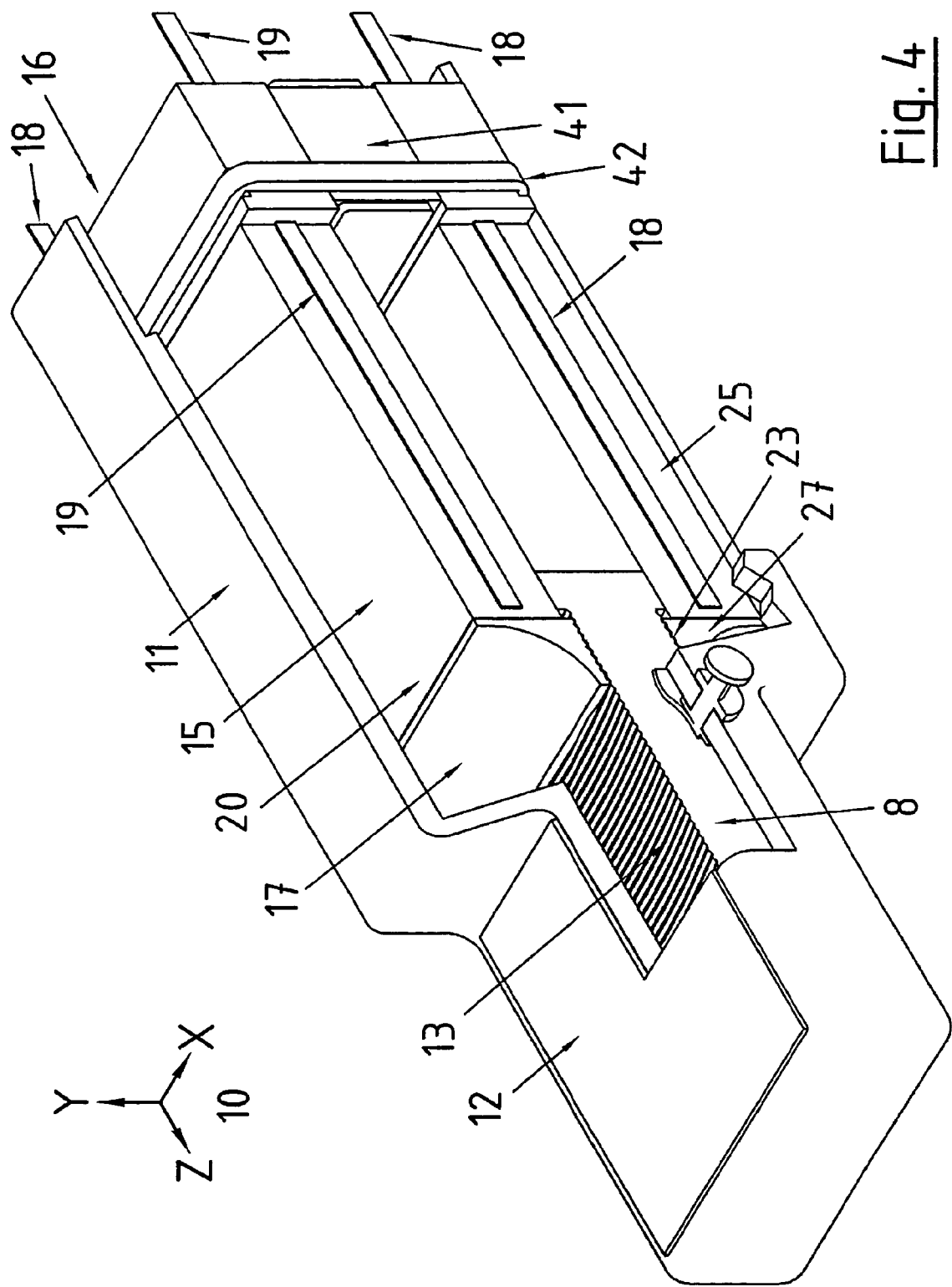
FIG. 4 is a cutaway isometric view of an electrically adjustable variable capacitor device showing a fully extended movable piston electrode.

FIG. 4 is a cutaway view showing the position of piston electrode 8 that is nearly fully extended resulting in a nearly maximum capacity between stator electrode 12 and piston electrode 8. The labeling of parts of FIG. 4 is the same for the same parts as shown in FIG. 1.

Figure 3B:
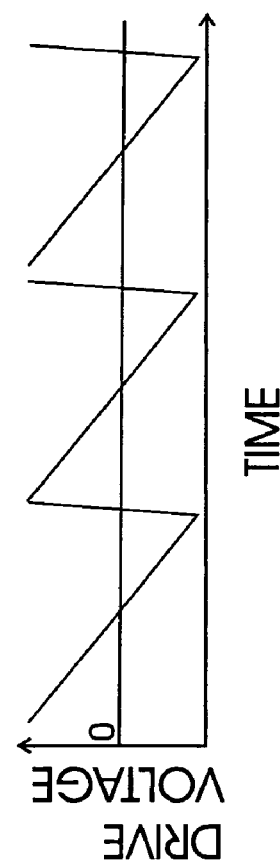
FIG. 3B is a sawtooth waveform with a rapidly rising component and a slowly falling component.

Applying a sawtooth drive voltage that rises quickly and falls slowly between lead 18 and return lead 19 as sketched in FIG. 3B, moves piston electrode 8 along the negative z-axis thereby decreasing the capacitance between stator electrode 12 and conductive surface 13 of piston electrode 8. FIG. 1 is a cutaway view of the electrically variable capacitor with piston electrode 8 fully retracted resulting in a minimum capacity between stator electrode 12 and piston electrode 8.

The electrically adjustable variable capacitor device of FIGS. 1 and 4 are symmetric about the Y=0 plane of coordinate system 10, so a second piezoelectric transducer 25 with its friction plate is identical to piezoelectric transducer 15, but has been rotated by 180 degrees about the z-axis. Piezoelectric transducers 15 and 25 facing each other, and both fixed to dielectric housing 11 at their proximal ends 16. Friction plates 17 and 27 (of FIG. 4) are mounted on the distal ends 20 of piezoelectric transducers 15 and 25 respectively. Stator electrode 22 is indicated by the dotted line is symmetric with stator electrode 12. Piezoelectric transducer 25 is identical in construction to piezoelectric transducer 15, being made up of individual piezoelectric elements and connected in the same way. The individual elements of transducer 25 are connected to lead 18 and return lead 19. In operation lead 18 and return lead 19 of piezoelectric transducer 25 are connected to lead 18 and return lead 19 of transducer 15. By applying a sawtooth voltage that rises slowly and falls quickly, friction plate 27 is moved along the positive z-axis in synchronism with the motion of friction plate 17. The friction coupling of friction plates 17 and 27 to piston electrode 8 causes it to move along the positive z-axis of coordinate system 10. This motion increases the capacitance of the first capacitor formed by stator electrode 12 and conductive surface 13 of piston electrode 8, and also increases the capacitance of the second capacitor formed by stator electrode 22 and conductive surface 23 of piston electrode 8. The conductive surfaces 13 and 23 of piston electrode 8 are electrically connected thereby connecting the first and second capacitors in series, so capacitance between stator electrodes 12 and 22 also increases corresponding to the series capacitance of said first and second capacitors. A sawtooth voltage drive that rises quickly and falls slowly applied to both piezoelectric transducers via leads 18 and return leads 19 causes a decrease in capacitance between stator electrodes 12 and 22.

Piston electrode 8 is common to said first and second capacitors. Electrically connecting stator electrode 12 to stator electrode 22 forms a common connection to the stator electrodes of the first and second capacitors. Electrical connection to terminal 4 and the common connection of the stator electrodes 12 and 22 provide external parallel connections of the two capacitors.

The piezoelectric transducers 15 and 25 are held in place by tension block 41, providing the correct spacing of transducers 15 and 25. Tension band 42 presses the transducers against tension block 41 and insures that friction plates 17 and 27 maintain contact with conductive surfaces 13 and 23 of the piston.

Figure 5A:
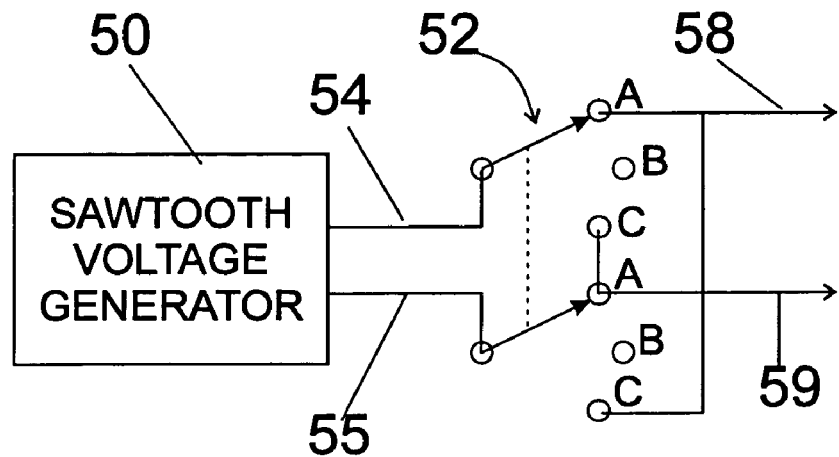
FIG. 5A is an operating control unit, which shows a connection diagram of a sawtooth wave generator and switch apparatus for applying and selecting the polarity of the sawtooth output to drive the piezoelectric transducers of an electrically adjustable variable capacitor device.

Manual adjustment of an electrically adjustable capacitor device is achieved through the circuit of FIG. 5A. Sawtooth Voltage Generator 50 supplies a slowly rising voltage followed by a rapid fall. Typically the voltage slowly rises from −100 volts to +100 volts, and then quickly falls back to −100 volts. The voltage appears on output lead 54 and the return lead 55. The time taken for the voltage to rise typically is 10 or more times longer than the time for the voltage to fall. The output leads 54 and return lead 55 are coupled to double pole, 3-position switch 52. FIG. 5A shows switch 52 in position A with output lead 54 coupled to lead 58 and return lead 55 is coupled to lead 59. Lead 58 is coupled to leads 18 of FIGS. 1, 2 and 4, and lead 59 is coupled to return leads 19 of FIGS. 1, 2 and 4. With this connection arrangement, switch 52 enables the operator to adjust the capacitance of the electrically adjustable variable capacitor device of FIGS. 1 and 4. With switch 52 in position A as shown in FIG. 5A, the voltage will slowly rise and quickly fall on leads 18 of FIGS. 1, 2 and 4 causing the capacity to increase. With the switch 52 in position B, no voltage is applied, and the capacitance value remains at the value it had just before the switch was changed. With switch 52 in position C, the voltage on leads 18 will rise quickly and fall slowly causing the capacitance of the electrically adjustable variable capacitor device of FIGS. 1 and 4 to decrease capacity. The switch 52 of FIG. 5A can be placed at the operator's console, or any other place that is convenient for the operator. One switch is used for each electrically adjustable variable capacitor.

Figure 5B:
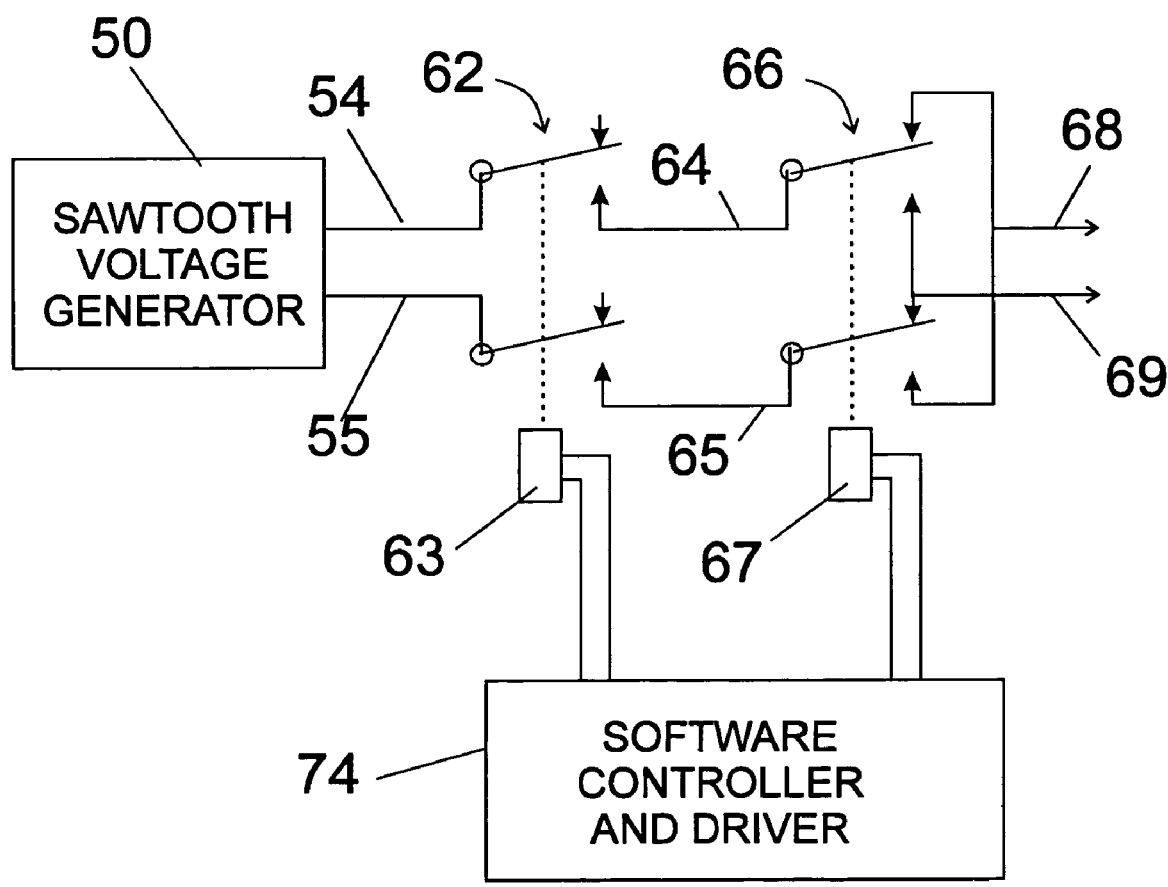
FIG. 5B is an operating control unit, which shows a connection diagram of a sawtooth wave generator and software controlled relay apparatus that select and control the sawtooth signals applied to the piezoelectric transducer thereby providing automatic adjustment capability of a electrically adjustable variable capacitor device.

Automatic adjustment of the electrically adjustable variable capacitor device is achieved through the circuit of FIG. 5B. Sawtooth Voltage Generator 50 supplies a slowly rising voltage followed by a rapid fall on output lead 54 and return lead 55. Relay 62 is a double pole single throw relay that when activated connects the output of sawtooth voltage generator 50 leads 54 and 55 to leads 64 and 65 respectively. Relay 66 is a double pole double throw relay that when activated couples leads 64 to lead 69 and 65 to lead 68. When not activated, relay 66 connects lead 64 to lead 68 and lead 65 to lead 69. Lead 68 is coupled to leads 18 of FIGS. 1, 2 and 4, and lead 69 to leads 19 of FIGS. 1, 2 and 4. Relay coils 63 and 67 of FIG. 5B are coupled to software controller and driver 74. The software is designed to adjust tune and match capacitors of a probe using signals reflected from the probe. A single sawtooth generator may be used to supply all electrically adjustable variable capacitor devices, but separate relay circuits and relays are used for each electrically adjustable capacitor device.

A second embodiment of a variable capacitor driven by a linear motor employs surface acoustic waves known as Rayleigh waves. The Rayleigh waves are frictionally coupled to the piston head. In response to a propagating Rayleigh wave, surface molecules of the propagating medium undergo an elliptical motion. Frictional contact of the piston head with these surface molecules causes the piston head to move in response to the motion of the surface molecules.

Figure 6:
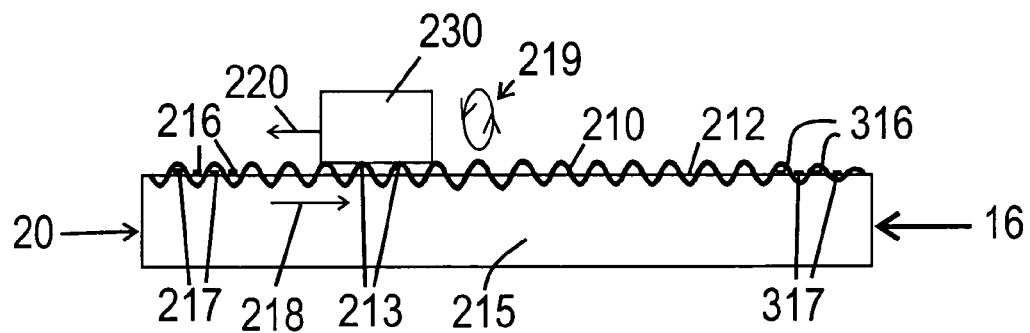
FIG. 6 illustrates the motion of a progressive surface acoustic wave on a piezoelectric substrate.

FIG. 6 illustrates a surface acoustic wave 210 propagating along the surface of piezoelectric substrate 215 from distal end 20 toward proximal end 16 as indicated by arrow 218. The piezoelectric substrate 215 may be composed of a piezoelectric material such as Y-cut lithium niobate or Y-cut crystalline quartz. Molecules on surface of piezoelectric substrate 215 undergo an elliptical motion as illustrated by ellipse 219. Piston head 230 makes frictional contact with the molecule at the wave crests 213 that are moving in the direction of arrow 220. The piston head 230 loses contact with these molecules as the wave moves on and the molecules move below the normal active surface 212 to form a trough. Friction between piston head 230 and molecules at the wave crests 213 causes the piston head to move in the same direction as the wave crests 213.

Applying a radio-frequency voltage between interdigital electrodes 216 and 217 excites the surface acoustic wave 210, which propagates along active surface 212 of piezoelectric substrate 215 in the direction of arrow 218. As the wave propagates it is somewhat attenuated by the absorption of acoustic energy in the piezoelectric substrate. It may be further attenuated by coupling of some of its energy out through the interdigital electrodes 316 and 317 located at proximal end 16 of piezoelectric substrate 215. Coupling electrodes 316 and 317 to load resistors (shown in FIG. 9A) may dissipate this energy.

Figure 7:
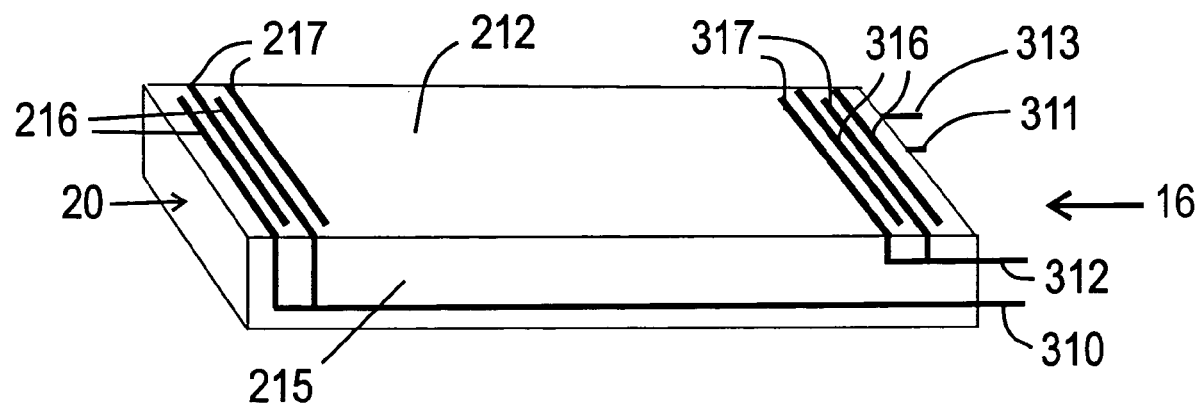
FIG. 7 illustrates the interdigital electrodes arrangement used to launch surface waves in either direction along the length of a piezoelectric substrate.

Referring to FIG. 7, a set of interdigital electrodes 216 and 217 located near the distal end 20 of piezoelectric substrate 215 and are electrically coupled to leads 310 and 311 respectively. A second set of interdigital electrodes 316 and 317 are located near the proximal end 16 of piezoelectric substrate 215 and are electrically coupled to leads 313 and 312 respectively. The two sets of interdigital electrodes are fixed to the active surface 212 of piezoelectric substrate 215.

Figure 8:
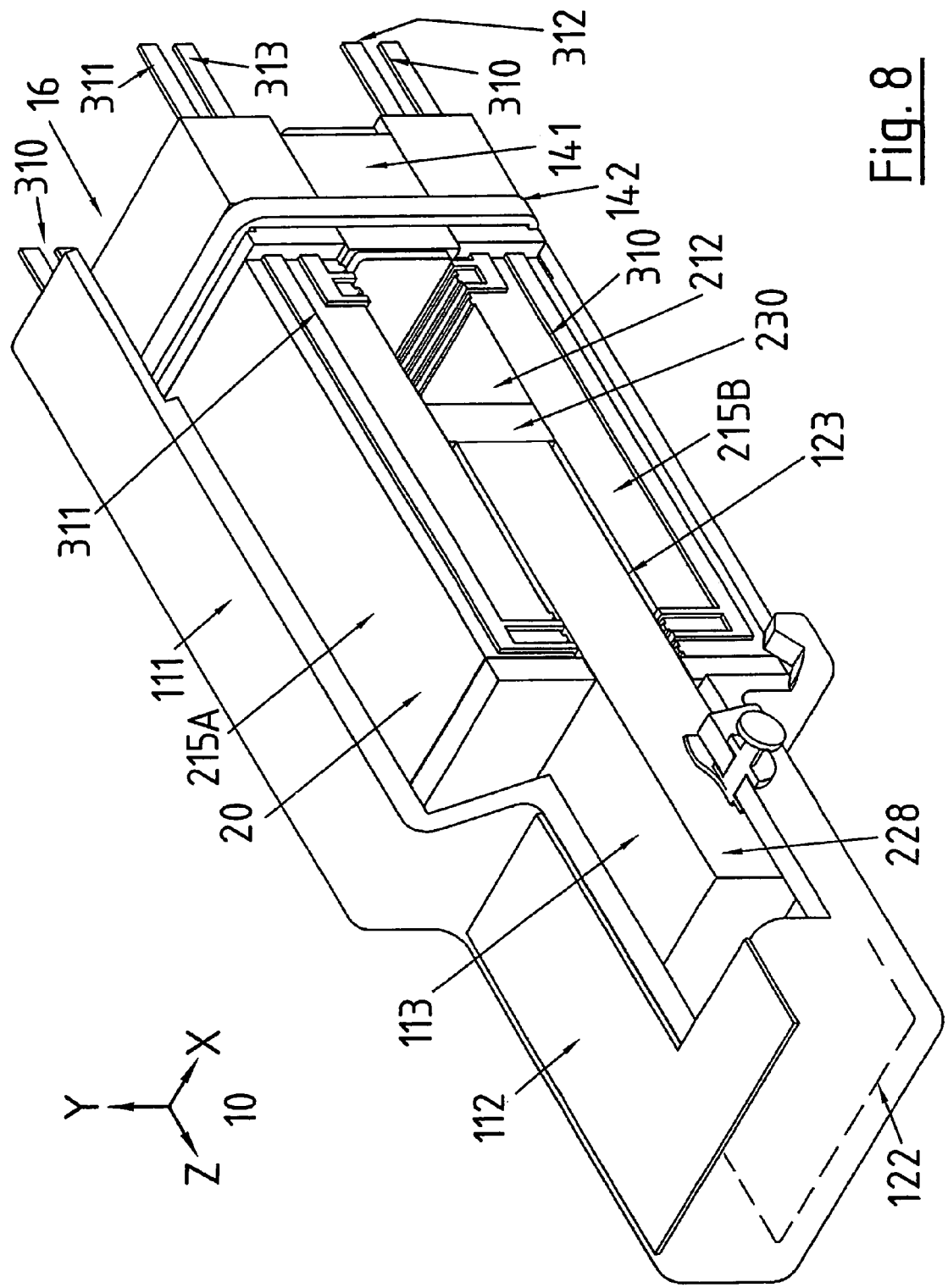
FIG. 8 is a cutaway isometric view of electrically adjustable variable capacitor device using surface acoustic waves to change the capacitance.

FIG. 8 is a cutaway view of a complete electrically tunable variable capacitor device using two piezoelectric substrates 215A and 215B that are identical with piezoelectric substrate 215 of FIG. 7. Each piezoelectric substrate 215A and 215B has the same interdigital and lead connections as piezoelectric substrate 215 and is connected as shown in FIG. 7. The piezoelectric substrates 215A and 215B only differ in that one has been rotated by 180 degrees about the z-axis of coordinate system 10 of FIG. 8. Piston head 230 makes friction contact with the active surface 212 of piezoelectric substrates 215A and 215B. Tension block 141 at proximal end 16 provides spacing between piezoelectric substrates 215A and 215B at a distance equal to the y-dimensions of piston head 230 thereby enabling movement of piston electrode 228. Tension band 142 provides pressure to preventing slippage of piston head 230 when the piezoelectric substrates 215A and 215B are not electrically activated.

Piston head 230 is fixed to the end of piston electrode 228. Both sides of piston electrode 228 have conductive surfaces 113 and 123, and the two sides are electrically connected. Dielectric housing 111 supports stator electrodes 112 and 122 on the exterior of the housing. Stator electrode 112 and conductive surface 113 of the moveable piston electrode 228 form a first variable capacitor and stator electrode 122 and conductive surface 123 of the movable piston electrode 228 form a second variable capacitor. Since these two variable capacitors are connected in series, stator electrode 112 and 122 also form the terminals of an electrical adjustable variable capacitor. By providing a terminal arrangement with a sliding electrical contact similar to that of FIGS. 1 and 4 with terminal 4 connected to the movable piston electrode by feed-through 7 and sliding contact 6, parallel operation of the two capacitors is achieved.

Figure 9A:
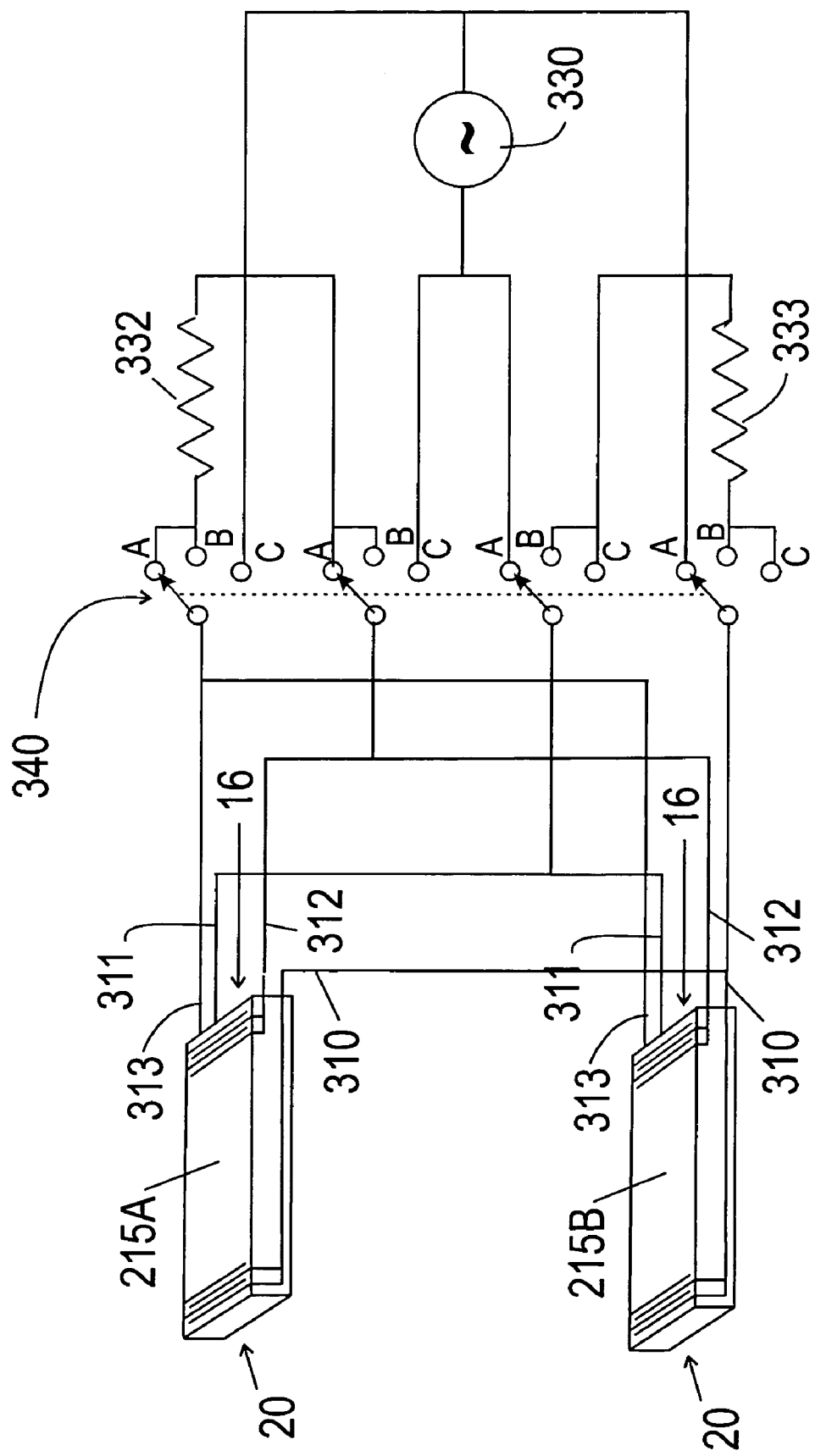
FIG. 9A is a variable capacitor assembly comprising an operating control unit to enable manual adjustment of an electrically adjustable variable capacitor device employing surface acoustic waves.

The operating control unit of FIG. 9A provides manual adjustment means of the surface wave electrically adjustable variable capacitor device. For clarity of the wiring, both piezoelectric substrates 215A and 215B are shown in the same orientation, however when installed in the dielectric housing 111 of FIG. 8, piezoelectric substrate 215A must be rotated by 180 degrees about the z-axis. The 4-pole, 3-position switch 340 provides proper connections of leads 310–313 to the RF generator 330 and loading resistors 332 and 333. When switch 340 is in position A, power from RF generator 330 is applied to leads 310 and 311 producing an acoustic wave on piezoelectric substrate 215A. The acoustic wave is propagating from the distal end 20 toward the proximal end 16 thereby increasing the capacity of the electrically adjustable variable capacitor of FIG. 8. Leads 312 and 313 are connected to loading resistor 332 that absorbs energy induced into the interdigital electrodes at the proximal end 16, and thereby minimizing any surface waves reflected at the proximal ends of piezoelectric substrates 215A and 215B. With switch 340 in position B, no RF energy is applied to piezoelectric substrates 215A and B. Loading resistors 332 and 333 will attenuate any remaining surface acoustic waves. With switch 340 in position C, radio frequency power from RF generator is applied to leads 312 and 313 producing an acoustic wave propagating from proximal end 16 toward distal end 20 of piezoelectric substrates 215A and B thereby decreasing the capacity of the electrically adjustable variable capacitor. Loading resistor 333 absorbs energy induced into the interdigital electrodes at the distal end 20 of piezoelectric substrates 215A and B minimizing waves that might be reflected at the distal end.

Figure 9B:
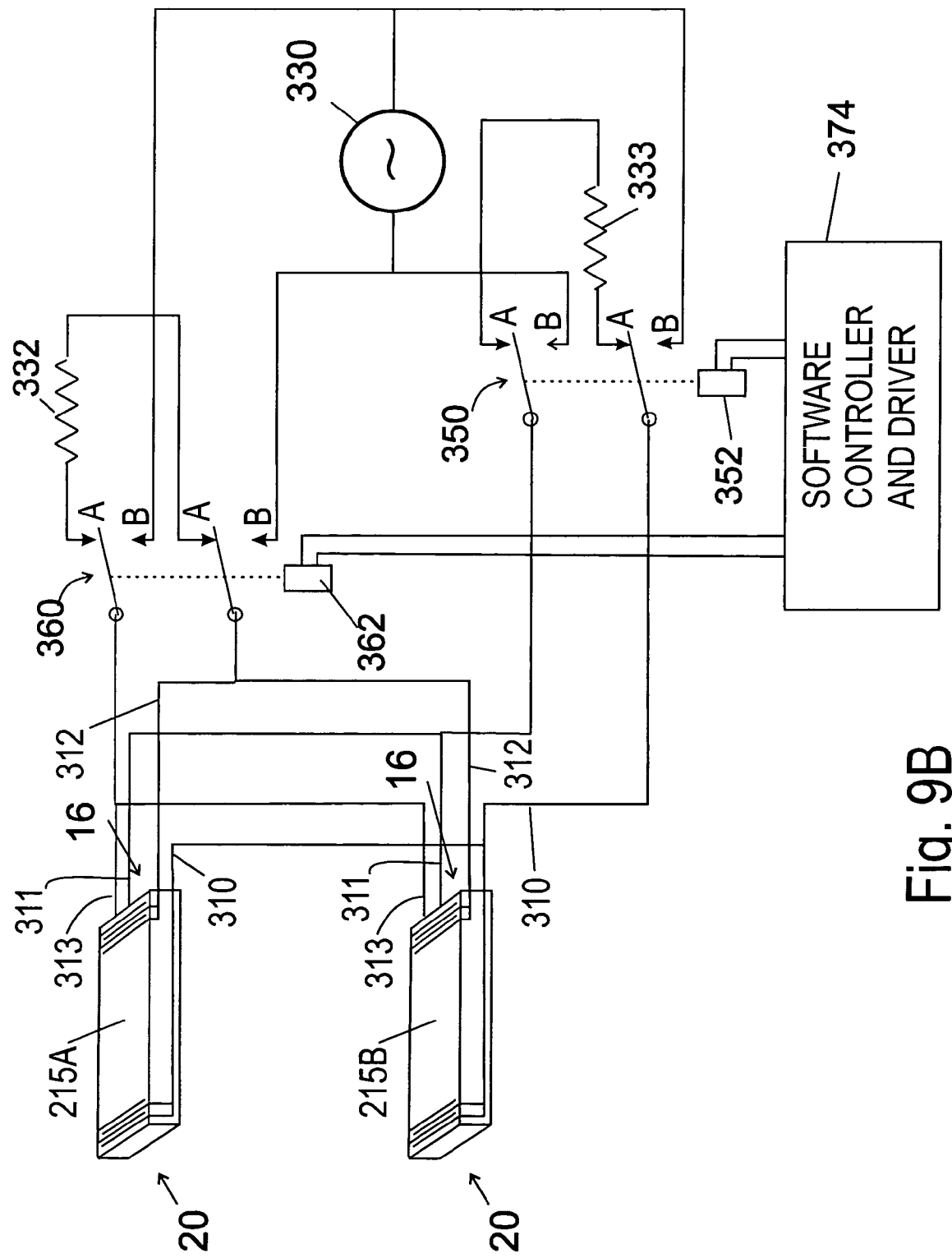
FIG. 9B is a diagram of a variable capacitor assembly comprising an operating control unit to enable automatic adjustment of an electrically adjustable variable capacitor employing surface acoustic waves.

Automatic adjustment of the electrical adjustable capacitor is acheved through the operating control unit of FIG. 9B. Relays 350 and 360 are electrically controlled by software controller and driver 374. The software is designed to adjust electrically adjustable variable capacitor device shown in FIG. 8. This capacitor, for example may tune or match variable capacitors of an NMR probe by using signals reflected from the probe. Each relay of FIG. 9B is a double pole, double throw type. With no power applied the contacts of each relay are in the A-position and with activation the contacts are in the B-position. The software controller and driver 374 controls relays 350 and 360 by controlling the driving power applied to relay coils 352 and 362 respectively. With power removed from both coils 352 and 362, the contacts of both relays are in the A-position and no RF power from the RF generator 330 is applied to piezoelectric substrates 215A and B, and the capacitor is in a quiescent state. To increase the capacity of the voltage adjustable variable capacitor device software controller and driver 374 applies power only to relay coil 352 causing the contacts of relay 350 to move to the B-position while and the contacts of relay 360 remain in the A-position. With this arrangement radio frequency oscillator 330 is connected to the interdigital electrodes at the distal end 20 of transducer substrates 215A and B, causing surface waves to propagate from the distal end 20 toward the proximal end 16. The reflected power is minimized as relay 360 is in the A-position so that energy arriving at the proximal end 16 of piezoelectric substrate 215 is partially adsorbed by loading resistor 332. With this switch arrangement the capacity of the electrical adjustable variable capacitor of FIG. 8 increases.

Conversely to decrease the capacity of the voltage adjustable variable capacitor device software controller and driver 374 applies power only to relay coil 362 causing the contacts of relay 360 to move to the B-position while and the contacts of relay 350 remain in the A-position. With this arrangement radio frequency oscillator 330 is connected to the interdigital electrodes at the proximal end 16 of transducer substrates 215A and B, causing surface waves to propagate from the proximal end 16 toward the distal end 20. The reflected power is minimized as relay 350 is in the A-position so that energy arriving at the proximal end 16 of piezoelectric substrate 215 is partially adsorbed by loading resistor 333. With this switch arrangement the capacity of the electrical adjustable variable capacitor of FIG. 8 decreases. When power is removed from coils 352 and 362 the capacitor maintains the capacitance value it had just before the power was removed.

Additionally, driving the set of electrodes on the end of the transducer receiving the acoustic wave with an electrical signal phased to absorb the energy of this wave would eliminate the need for resistors 332 and 333 and their associated relay connections.

Although the invention has been described in its preferred embodiments, those skilled in the art will recognize many variations may be made thereto without departing from the spirit and scope of the invention. A progressive surface acoustic waves could be produced a number of ways, for example by two piezoelectric transducers spaced a quarter wavelength apart and driven by an RF frequency that has a 90 degree phase lead or lag to one of the transducers. By interchanging the drives to the two transducers, the direction of the progressive is reversed. A progressive bending wave could be used inplace of a surface acoustic wave to achieve similar results.

The invention has been illustrated as part of magnetic resonance spectrometer, and indeed it has great utility in this application. Those skilled in the art will recognize the invention has utility in many other applications as well, such as in tuning and matching of electrical circuits in radio, television, radar and many other electrical and electronic devices.

The invention of applying electrical signals to a linear motor to adjusting a variable capacitor has been illustrated using piezoelectric transducers to convert the electrical energy to linear mechanical motion. It will be obvious to those skilled in the art there are many other ways to convert electrical energy to linear mechanical motion including using electromagnetic and electrostatic forces.

PART NUMBERS

| | |
|---|---|
| 4 | electrical terminal |
| 6 | contacting finger |
| 7 | electrical feed-through |
| 8 | piston electrode |
| 10 | coordinate system |
| 11 | dielectric housing |
| 12 | stator electrode |
| 13 | conductive surface |
| 15 | piezoelectric transducer |
| 16 | proximal end |
| 17 | friction plate |
| 18 | lead |
| 19 | return lead |
| 20 | distal end |

-continued

PART NUMBERS

| | |
|---|---|
| 22 | stator electrode |
| 23 | conductive surface |
| 25 | piezoelectric transducer |
| 27 | friction plate |
| 30 | actuators |
| 32 | conductive electrodes |
| 41 | tension block |
| 42 | tension band |
| 50 | sawtooth voltage generator |
| 52 | double pole, 3 position switch |
| 54 | output lead |
| 55 | return lead |
| 58, 59 | output leads |
| 62 | relay (double pole single throw) |
| 63 | relay coil |
| 64, 65 | leads |
| 66 | relay (double pole double throw) |
| 67 | relay coil |
| 68, 69 | leads |
| 74 | software controller and driver |
| 111 | dielectric housing |
| 112 | stator electrodes |
| 113 | conductive surface |
| 122 | stator electrode |
| 123 | conductive surface |
| 141 | tension block |
| 142 | tension band |
| 210 | surface acoustic wave |
| 212 | active surface (of piezoelectric substrate 215) |
| 213 | wave crest |
| 215 | piezoelectric substrate |
| 215A, 215B | piezoelectric substrate |
| 216, 217 | interdigital electrodes |
| 218 | arrow (direction of wave propagation) |
| 219 | ellipse (representing the motion of surface molecules) |
| 220 | arrow (direction of motion of piston head) |
| 228 | piston |
| 230 | piston head |
| 310, 311 | electrical leads |
| 312, 313 | electrical leads |
| 316, 317 | interdigital electrodes |
| 330 | RF generator |
| 332, 333 | loading resistors |
| 340 | 4-pole, 3-position switch |
| 350 | double pole, double throw relay |
| 352 | relay coil |
| 360 | double pole, double throw relay |
| 362 | relay coil |
| 374 | software controller and driver |

What is claimed is:

1. An electrically adjustable variable capacitor device comprising:
   a housing made of dielectric material;
   at least one stator electrode placed on an exterior of said housing and a movable electrode placed within an interior of said housing and forming a variable capacitor therebetween;
   a linear motor placed within said housing, said motor comprising at least one transducer fixed by its proximal end to said housing and coupled to said movable electrode by a mechanical coupling; and
   electrical conductors coupled to said transducer providing application of electrical signals, which adjust the capacitance of said variable capacitor.

2. The electrically adjustable variable capacitor device of claim 1, wherein said movable electrode comprises a piston with a conductive surface.

3. The electrically adjustable variable capacitor device of claim 2, wherein said linear motor is a linear piezoelectric motor.

4. The electrically adjustable variable capacitor device of claim 3, further comprising:
- at least another stator electrode, which is placed on the exterior of said housing opposite to said at least one stator electrode, said at least another stator electrode and said movable electrode forming a second variable capacitor; and
- at least another transducer fixed by its proximal end to said dielectric housing and spaced apart from said at least one transducer by a tension block.

5. The electrically adjustable variable capacitor device of claim 4, wherein each said transducer comprises a plurality of actuators and a plurality of conductive electrodes connected by an electric circuit, each said actuator is bounded by the conductive electrodes and has an opposite polarity to an adjacent actuator.

6. The electrically adjustable variable capacitor device of claim 5, wherein said actuators comprise crystalline quartz or poled lead zirconate titanate (PZT).

7. The electrically adjustable variable capacitor device of claim 6, wherein said mechanical coupling comprises a friction coupling, which activates or terminates an expansion of said transducers relative to said movable electrode in response to the electrical signals applied thereto; said friction coupling comprises a friction plate mounted on a distal end of each said transducer and a tension band maintaining frictional contact between said transducers and said movable electrode.

8. The electrically adjustable variable capacitor device of claim 7, wherein the electrical signals, which displace said movable electrode are applied in a form of a sawtooth voltage with a slowly rising and a rapidly falling components.

9. The electrically adjustable variable capacitor device of claim 7, wherein the electrical signals, which displace said movable electrode are applied in a form of a sawtooth voltage with a rapidly rising and a slowly falling components.

10. An electrically adjustable variable capacitor device comprising:
- a housing made of dielectric material;
- a pair of stator electrodes placed respectively on opposite sides of an exterior of said housing and a movable electrode placed within an interior of said housing, each said stator electrode and said movable electrode forming a variable capacitor therebetween; and
- a linear motor placed within the interior of said housing and comprising:
  - a pair of spaced apart piezoelectric substrates, each respectively coupled to said movable electrode,
  - a tension block connected to proximal ends of said piezoelectric substrates and fixed to said housing,
  - an electrode means deposited on facing each other surfaces of said piezoelectric substrates providing excitation of surface acoustic waves along said surfaces facing each other, when a radio frequency voltage is applied thereto, and
  - a piston head fixed to said movable electrode and frictionally coupled to the surfaces of said piezoelectric substrate, providing adjustment of a capacitance of said variable capacitors.

11. The electrically adjustable variable capacitor device of claim 10, wherein said electrode means comprises two sets of interdigital electrodes, each set is placed at a distal and a proximal end of said piezoelectric substrate and are electrically coupled to four leads.

12. The electrically adjustable variable capacitor device of claim 11, wherein said piezoelectric substrate comprises Y-cut lithium niobate.

13. An electrically adjustable variable capacitor assembly comprising:
- a housing made of dielectric material;
- a pair of stator electrode and a movable electrode having a piston with conductive surface, said stator electrodes placed on opposite sides of an exterior and said movable electrode within an interior of said housing, forming a variable capacitor between each said stator electrode and said movable electrode;
- a linear motor having a pair of transducers each fixed by its proximal end to the interior of said housing, spaced apart by a tension block and coupled to said movable electrode by a friction coupling; said friction coupling comprising a friction plate mounted on a distal end of each transducer and a tension band maintaining frictional contact between said transducers and said movable electrode;
- electrical conductors coupled to said transducers; and
- operating control unit coupled to said electrical conductors providing electrical adjustment of the capacitance of said variable capacitors.

14. The electrically adjustable variable capacitor assembly of claim 13, wherein said linear motor is a piezoelectric motor with transducers each having a plurality of actuators and a plurality of conductive electrodes connected by an electric circuit, each said actuator is bounded by the conductive electrodes and has an opposite polarity or orientation with an adjacent actuator.

15. The electrically adjustable variable capacitor assembly of claim 14, wherein said operating variable capacitor unit, which directs electrical signal applied to said linear piezoelectric motor, comprises an electrical signal source and manually operated electrical switch for each said variable capacitor.

16. The electrically adjustable variable capacitor assembly of claim 14, wherein said operating variable capacitor unit, which directs and controls electrical signal applied to said linear piezoelectric motor, comprises a sawtooth voltage generator and a pair of switching circuits for a respective pair of said variable capacitors, each said switching circuit is connected to a software controller and driver.

17. An electrically adjustable variable capacitor assembly comprising:
- a housing made of dielectric material;
- a pair of stator electrodes and a movable electrode, the stator electrodes are placed respectively on opposite sides of an exterior of said housing, movable electrode is placed within an interior of said housing and forming variable capacitors between each said stator electrode and said movable electrode;
- a linear motor having:
- a pair of piezoelectric substrates, each having a distal and a proximal ends and coupled to said movable electrode,
- interdigital electrodes deposited on opposite sides of facing each other surfaces of said piezoelectric substrates causing excitation of surface acoustic waves when a radio frequency voltage is applied thereto, each said piezoelectric substrate comprising four sets of said interdigital electrodes deposited equally between said distal and said proximal ends;
- a piston head fixed to said movable electrode and frictionally coupled to the surfaces of said piezoelectric substrates by surface acoustic waves, which propagate along the surfaces of said substrates and move said piston head therewith, adjusting the capacitance of said variable capacitors;

four leads electrically coupled with said interdigital electrodes; and operating control unit coupled to said four leads, said unit providing application of a radio frequency voltage to a selected sets of interdigital electrodes deposited at the distal or proximal ends of said pair of piezoelectric substrate.

18. The electrically adjustable variable capacitor assembly of claim 17, wherein said variable capacitors are connected in series.

19. The electrically adjustable variable capacitor assembly of claim 17, wherein said movable electrode is electrically connected to an external terminal providing external parallel connections of said variable capacitors.

20. The electrically adjustable variable capacitor assembly of claim 18, wherein said operating control unit comprises a radio frequency power generator connected to said leads via a manually operated electrical switch for each said variable capacitor.

21. The electrically adjustable variable capacitor assembly of claim 18, wherein said operating control unit comprises a radio frequency power generator connected to said leads via one or more electrically operated switches.

22. A method of adjusting a variable capacitor utilizing a linear piezoelectric motor comprising the steps of:

forming at least one variable capacitor between a movable electrode and a stator electrode;

mechanically coupling at least one transducer of the linear piezoelectric motor to said movable electrode; and adjusting a capacitance of said at least one variable capacitor by changing an electrical signal applied to said at least one transducer.

23. The method of adjusting a variable capacitor utilizing a linear piezoelectric motor of claim 22, further comprising the step of applying sawtooth electrical signals to said transducer.

24. The method of adjusting a variable capacitor utilizing a linear piezoelectric motor of claim 22, further comprising the step of applying radio frequency signals to said transducer.

* * * * *